(12) United States Patent
Farrens et al.

(10) Patent No.: US 9,716,023 B2
(45) Date of Patent: Jul. 25, 2017

(54) METHODS FOR TEMPORARILY BONDING A DEVICE WAFER TO A CARRIER WAFER, AND RELATED ASSEMBLIES

(71) Applicant: Micron Technology, Inc., Boise, ID (US)

(72) Inventors: Sharon N. Farrens, Boise, ID (US); Neal Bowen, Kuna, ID (US); Andrew M. Bayless, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 336 days.

(21) Appl. No.: 14/332,096

(22) Filed: Jul. 15, 2014

(65) Prior Publication Data
US 2016/0020129 A1    Jan. 21, 2016

(51) Int. Cl.
| | | |
|---|---|---|
| *B29C 53/82* | (2006.01) | |
| *B29C 65/00* | (2006.01) | |
| *B32B 37/00* | (2006.01) | |
| *B32B 7/14* | (2006.01) | |
| *C09J 5/04* | (2006.01) | |
| *H01L 21/00* | (2006.01) | |
| *H01L 21/30* | (2006.01) | |
| *H01L 21/46* | (2006.01) | |
| *H01L 21/683* | (2006.01) | |
| *B32B 37/12* | (2006.01) | |

(Continued)

(52) U.S. Cl.
CPC .......... *H01L 21/6835* (2013.01); *B32B 5/142* (2013.01); *B32B 37/1292* (2013.01); *B32B 7/12* (2013.01); *B32B 38/105* (2013.01); *B32B 2250/02* (2013.01); *B32B 2255/00* (2013.01); *B32B 2405/00* (2013.01); *B32B 2457/14* (2013.01); *H01L 2221/6834* (2013.01); *H01L 2221/68318* (2013.01); *H01L 2221/68327* (2013.01); *H01L 2221/68381* (2013.01)

(58) Field of Classification Search
CPC ....... H01L 21/6835; H01L 2221/68327; H01L 2221/6834; H01L 2221/68318; H01L 2221/68381; Y10T 156/10; Y10T 156/11; B32B 2457/14; B32B 43/006; B32B 37/1292; B32B 38/10; B32B 38/105; B32B 2038/0064
USPC ......... 156/60, 155, 290, 291, 310, 314, 315, 156/701; 438/455, 464, 118
See application file for complete search history.

(56) References Cited

U.S. PATENT DOCUMENTS

2011/0308739 A1* 12/2011 McCutcheon ........ H01L 21/187
156/766

OTHER PUBLICATIONS

Mitsui Chemicals: "Grades and Properties of APEL" http://www.mitsuichemicals.com/files/apel_ApelGrades.pdf.*

(Continued)

*Primary Examiner* — Philip Tucker
*Assistant Examiner* — Brian R Slawski
(74) *Attorney, Agent, or Firm* — TraskBritt

(57) ABSTRACT

A method of bonding a device wafer to a carrier wafer includes disposing a first adhesive over a central portion of a carrier wafer, the first adhesive having a first glass transition temperature, disposing a second adhesive over a peripheral portion of the carrier wafer, the second adhesive having a second glass transition temperature greater than the first glass transition temperature, and bonding the first adhesive to an active front side of the device wafer and the second adhesive to a peripheral portion of the front side of the device wafer. Related assemblies may be used in such methods.

18 Claims, 7 Drawing Sheets

(51) Int. Cl.
*B32B 5/14* (2006.01)
*B32B 7/12* (2006.01)
*B32B 38/00* (2006.01)

(56) References Cited

OTHER PUBLICATIONS

Smith, A. et al.: "A Chemical and Thermal Resistant Wafer Bonding Adhesive Simplifying Wafer Backside Processing" http://www.csmantech.org/Digests/2006/2006%20Digests/16D.pdf.*

* cited by examiner

METHODS FOR TEMPORARILY BONDING A DEVICE WAFER TO A CARRIER WAFER, AND RELATED ASSEMBLIES

TECHNICAL FIELD

Embodiments disclosed herein relate to fabrication of semiconductor devices. More specifically, embodiments disclosed herein relate to methods for temporarily bonding a device wafer to a carrier wafer for backside processing, and to related assemblies comprising a device wafer and carrier wafer.

BACKGROUND

Temporary bonding of a device wafer to a carrier wafer is an act significant to wafer-level processing techniques used in semiconductor manufacturing. The front side, which may also be characterized as the active surface, of a device wafer is bonded to a carrier wafer to support the device wafer and expose the backside of the device wafer for thinning and exposure of conductive vias (commonly termed through-silicon vias (TSVs)) formed through a partial thickness of the device wafer, as well as passivation of the backside of the thinned device wafer and formation of conductive contact pads and, optionally, a redistribution layer (RDL) thereon. After backside processing is complete, the device wafer may be removed from the carrier wafer, diced, and packaged.

Conventionally, a single thermoplastic adhesive is used for temporarily bonding the device wafer to the carrier wafer. FIGS. 1A through 1E illustrate a conventional temporary bonding process flow. FIG. 1A shows a device wafer 100 and a carrier wafer 102 with a layer of thermoplastic adhesive 104 disposed (e.g., spin coated) on a surface thereof. The thickness of the layer of adhesive 104 may be chosen based on, for example, the topography of an active surface 105 of the device wafer 100. Conventionally, the adhesive 104 is disposed to a thickness of between about 5 microns and 150 microns. As an example of a conventional device wafer configuration, the device wafer 100 may be substantially disc-shaped, and may be about 300 mm in diameter and have an initial thickness of about 750 microns. The device wafer 100 includes a plurality of in-process semiconductor devices, such as semiconductor memory, logic or processor dice, on the active surface 105 of the device wafer 100 facing the carrier wafer 102. The carrier wafer 102 is of a similar shape and size to the device wafer 100. One conventional thermoplastic adhesive material that has been used for adhesive 104 is WAFERBOND® HT-10.10, commercially available from Brewer Science, Inc., Rolla, Mo. After application of adhesive 104, carrier wafer 102 with the layer of adhesive 104 is baked to remove solvents from the adhesive 104, e.g., solvents within the as-applied adhesive that facilitate application of the adhesive.

Referring now to FIG. 1B, the device wafer 100 and the adhesive-coated carrier wafer 102 are bonded together by applying heat and pressure. For example, the device wafer 100 and the adhesive-coated carrier wafer 102 may be mechanically pressed together under elevated temperature conditions sufficient to soften the adhesive layer 104 and promote adhesion between the device wafer 100 and the carrier wafer 102. The temperature conditions during bonding may be chosen to approach or exceed a glass transition temperature ($T_g$) of the thermoplastic adhesive material of the adhesive layer 104. A portion of the softened adhesive 104 may squeeze out around a periphery of an interface 106 between the device wafer 100 and the carrier wafer 102 during bonding. Excess adhesive around the periphery of the interface 106 is removed, e.g., by dissolving the excess adhesive with a solvent.

A backside 108 of the device wafer 100 is thinned by a process such as abrasive grinding and/or chemical-mechanical polishing with or without dry etching. The thinning process may reduce the thickness of the device wafer 100 from an initial thickness of, for example, approximately 750 microns to a thickness of, for example, about 50 microns or less. As noted above, the thinning process may expose ends of conductive vias in the device wafer 100 on the backside 108 of the thinned device wafer 100. Passivation and formation of contact pads 110 (shown in FIG. 1C), with or without a redistribution layer (RDL) may follow thinning.

Referring now to FIG. 1D, after thinning and backside processing, the device wafer 100 may be removed from the carrier wafer 102 by heating the polymer adhesive 104 (FIG. 1A) and applying a shear force in direction 112 (i.e., a force generally parallel to the plane of the interface 106 (FIG. 1B) between the device wafer 100 and the carrier wafer 102). Heat-induced softening of the adhesive 104 enables the device wafer 100 to be slid off of the carrier wafer 102. A solvent may be used to clean (i.e., remove) residual adhesive from the device wafer 100, and the device wafer 100 may then be mounted on a film frame support system 114.

As shown in FIG. 1E, the device wafer 100, after being mounted on the film frame support system 114, may be separated, or "singulated," into individual dice 116. The individual dice may then be subsequently packaged or assembled with other dice and packaged to form a semiconductor device or integrated device.

Thermal cycles occurring during processing that take place while the device wafer 100 is bonded to the carrier wafer 102 may cause the adhesive 104 to soften, compromising the adhesion between the device wafer 100 and the carrier wafer 102. Furthermore, differing rates of thermal expansion between the wafer material and metallic features, such as TSVs, of the device wafer 100, and differing rates of thermal expansion between the wafer material and the adhesives may lead to warping of the bonded stack (i.e., the device wafer 100 and the carrier wafer 102 bonded by the adhesive 104) during thermal cycles. During processing, portions of the device wafer 100 may become non-parallel to the carrier wafer 102. For example, peripheral edges of the device wafer 100 may lift away (e.g., lose adhesion) from the carrier wafer 102. Areas of the device wafer 100 that lift away from the carrier wafer 102 may be thinned too much or non-uniformly during the thinning process, impacting the ability to use dice subsequently singulated from the device wafer 100 for three-dimensional integration in the form of stacked die assemblies. Lifting of edges of the device wafer 100 may also cause the device wafer 100 to crack or chip and may lead to loss of dice or of an entire device wafer 100, significantly reducing yield.

Moreover, adhesive material 104 that flows from the interface 106 between the device wafer 100 and the carrier wafer 102 may contaminate equipment used for backside processing, leading to costly downtime while the equipment is cleaned.

One other approach to temporary bonding of device wafers and carrier wafers is disclosed in United States Patent App. Pub. No. 2011/0308739 to McCutcheon et al.

McCutcheon et al. disclose the use of two different materials in a temporary wafer bonding process.

DETAILED DESCRIPTION

Figure 1A:
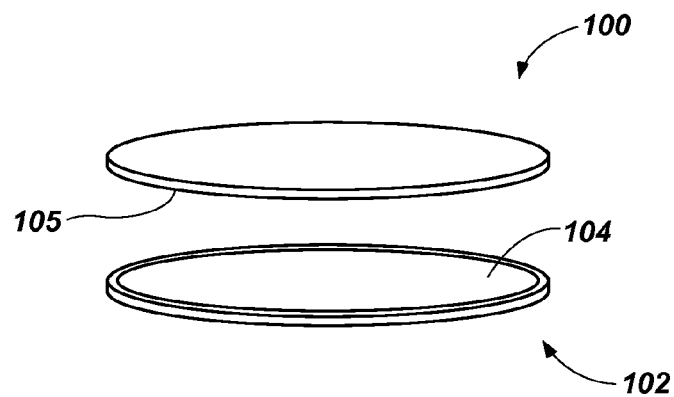
FIGS. 1A through 1E are perspective views showing a prior art temporary bonding method.
Figure 1B:
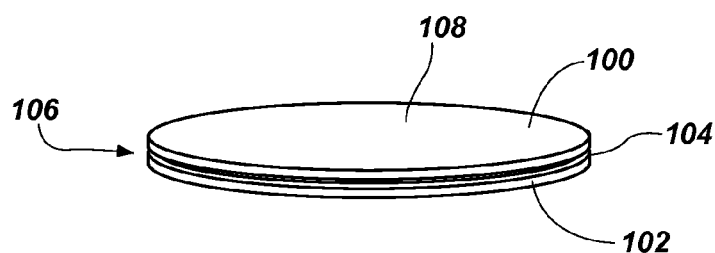
Figure 1C:
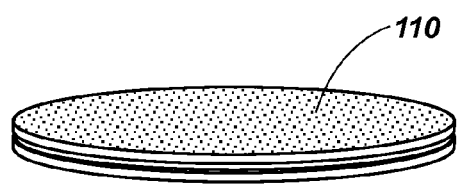
Figure 1D:
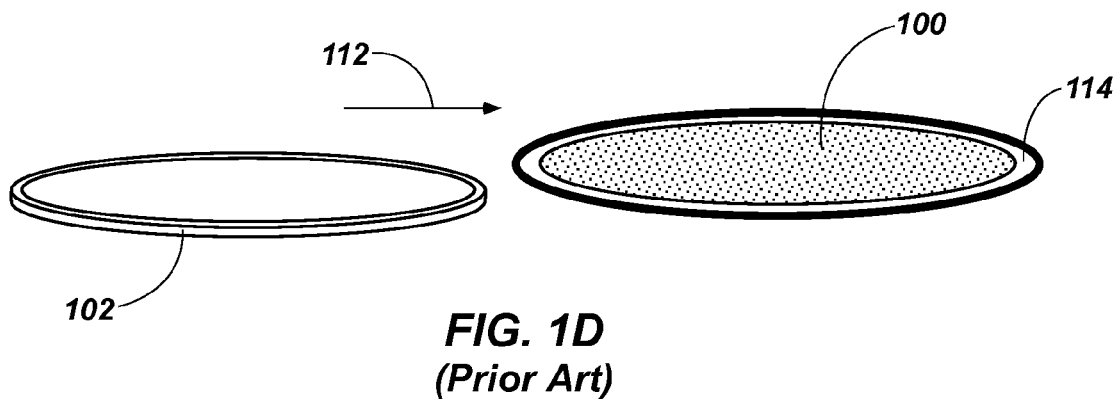
Figure 1E:
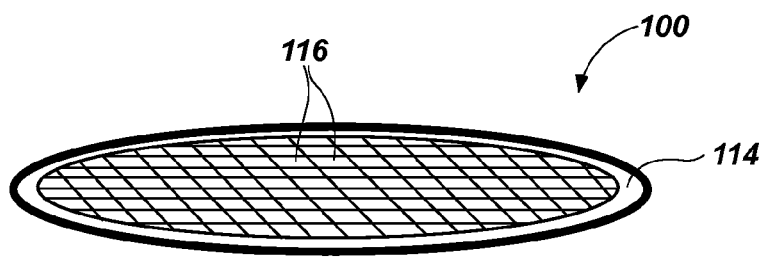

The illustrations included herewith are not meant to be actual views of any particular methods or devices, but are merely idealized representations that are employed to describe embodiments described herein. Elements and features common between figures may retain the same numerical designation except that, for ease of following the description, for the most part, reference numerals begin with the number of the drawing on which the elements are introduced or most fully discussed.

The following description provides specific details, such as material types, material thicknesses, and processing conditions in order to provide a thorough description of embodiments described herein. However, a person of ordinary skill in the art will understand that the embodiments disclosed herein may be practiced without employing these specific details. Indeed, the embodiments may be practiced in conjunction with conventional fabrication techniques employed in the semiconductor industry.

Figure 2:
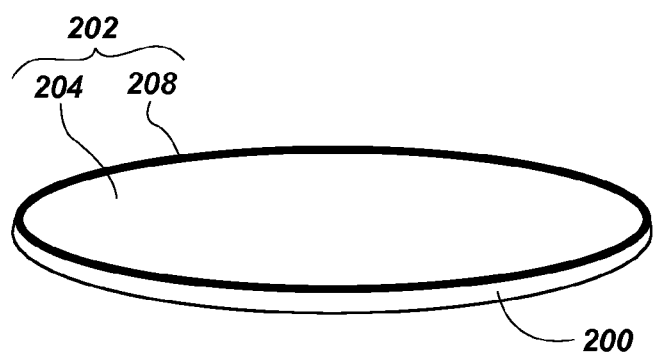
FIG. 2 is a perspective view of a carrier wafer with an adhesive material according to an embodiment of the present disclosure.

With reference now to FIG. 2, a carrier wafer 200 including an adhesive 202 according to the present disclosure is shown. The adhesive 202 may include a first adhesive 204 disposed over a central region of the carrier wafer 200 and a second adhesive 208 disposed over a peripheral region of the carrier wafer 200. The first adhesive 204 may be a thermoplastic adhesive with a glass transition temperature ($T_g$) of less than or equal to about two hundred degrees Celsius (200° C.). The first adhesive 204 may have a shear modulus in the range of 1e5 Pascals (Pa) at the $T_g$. As a non-limiting example, the first adhesive may be WAFER-BOND® HT-10.10 available from Brewer Science, Inc. of Rolla, Mo. Other suitable materials for the first adhesive may include, for example, WAFERBOND® HT-20.20, also available from Brewer Science, Inc., and TA13018A, likewise available from Brewer Science, Inc.

The second adhesive 208 may be a thermoplastic material with a $T_g$ higher than the $T_g$ of the first adhesive material 204. For example, the second adhesive 208 may have a $T_g$ of about fifteen degrees Celsius (15° C.), or more, higher than the $T_g$ of the first adhesive 204. As a non-limiting example, the $T_g$ of the second adhesive 208 may be between about fifteen degrees Celsius (15° C.) and about twenty-five degrees Celsius (25° C.) greater than the $T_g$ of the first adhesive 204. Suitable materials for the second adhesive 208 may include, without limitation, 9001A, available from Brewer Science, Inc., TA7000M available from Shin Etsu, Tokyo, Japan, or other adhesive materials having the desired characteristics.

Since the second adhesive 208 has a higher $T_g$ than the first adhesive 204, the second adhesive 208 may be used to function as a dam around an outer periphery of the carrier wafer 200, preventing flow and seepage of the first adhesive 204 from an interface between a device wafer and carrier wafer 200 under elevated temperatures encountered during processing of a device wafer bonded to carrier wafer 200.

The first adhesive 204 may be chosen in part based on a desired device feature density and topography of a device wafer to which the carrier wafer 200 is intended to be bonded. For example, a relatively lower viscosity adhesive may be suitable for a device wafer with a relatively higher feature density or higher topography, as the relatively lower viscosity adhesive may more easily wet and fill the fine features of the semiconductor device wafer.

The first adhesive 204 and the second adhesive 208 may be disposed to a thickness of, for example, between about fifty (50) microns and about one hundred fifty (150) microns. As a further non-limiting example, the first adhesive 204 and the second adhesive 208 may be disposed to a thickness of between about ninety (90) microns and about one hundred (100) microns. The first adhesive 204 may be formed on the carrier wafer 200 by conventional techniques, such as by spin coating, dry film lamination, or spray coating. The second adhesive 208 may be formed on the outer periphery of the carrier wafer 200 by conventional techniques, such as spraying, dispensing from a tip dispensing device, e.g., a syringe, or by other methods.

The carrier wafer 200 may have a substantially circular shape. As a non-limiting example, the carrier wafer 200 may have a diameter of about three hundred (300) mm and an initial thickness of about six hundred fifty (650) microns.

Figure 3A:
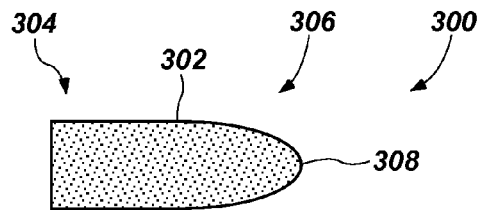
FIGS. 3A through 3I are cross-sectional views showing a temporary bonding method according to an embodiment of the present disclosure.
Figure 3B:
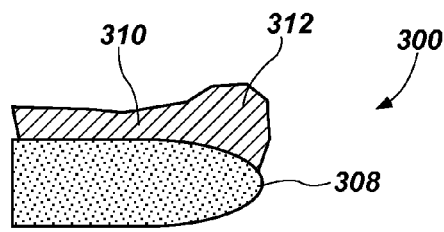

Now referring to FIGS. 3A through 3I, a process flow according to an embodiment of the present disclosure for temporarily bonding a device wafer to a carrier wafer is shown and described. FIG. 3A shows a cross-sectional view of a portion of a carrier wafer 300. The carrier wafer 300 includes a bonding surface 302 with a central portion 304 and a peripheral portion 306 adjacent a peripheral edge 308 of the carrier wafer 300. As shown in FIG. 3B, a first adhesive 310 may be applied to the bonding surface 302 of the carrier wafer 300. The carrier wafer 300 is shown coated with the first adhesive 310. The first adhesive 310 may be chosen from the materials discussed above with reference to first adhesive 204 (FIG. 2), or other suitable materials. The first adhesive 310 may be disposed over substantially the entire bonding surface 302, i.e., the first adhesive 310 may be disposed over the central portion 304 of the bonding surface 302 and the peripheral portion 306 of the bonding surface 302. As a non-limiting example, the first adhesive 310 may be disposed on the bonding surface 302 by spin coating. Surface tension within the first adhesive 310 may result in formation of a bead (i.e., a meniscus) 312 adjacent the peripheral edge 308 of the carrier wafer 300.

Figure 3C:
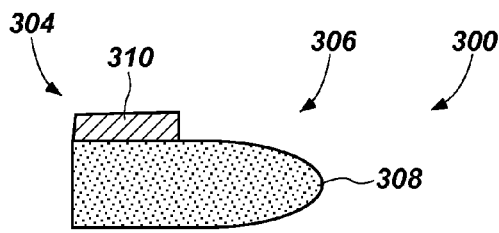

A portion of the first adhesive 310 may be removed from the peripheral portion 306 of the carrier wafer 300, as shown in FIG. 3C. The portion of the first adhesive 310 removed from the peripheral portion 306 of the carrier wafer 300 may include at least a portion of the bead 312. For example, FIG. 3C shows the carrier wafer 300 after the portion of the first adhesive 310 has been removed. As a non-limiting example, the first adhesive 310 may be removed from an area extending from the peripheral edge 308 inward toward the central portion 304 (i.e., radially inward) up to about twenty (20)

mm. In other embodiments, the first adhesive 310 may be removed from an area extending from the peripheral edge 308 inward toward the central portion 304 more than about twenty (20) mm. That portion of the first adhesive 310 may be removed by, e.g., dissolving the first adhesive 310 in a solvent or other edge bead removal process (e.g., dry etch, mechanical abrasion, or other). One example of a suitable solvent for removing WAFERBOND® HT-10.10 adhesive may be dodecene. Other solvents may also be suitable depending on the material used as the first adhesive 310. Alternatively or additionally, the first adhesive 310 may be removed mechanically.

Alternatively, the first adhesive 310 may be disposed over the central portion 304 of the carrier wafer 300 such that the peripheral portion 306 remains uncoated with the first adhesive 310. For example, a spin coating process may be tailored by adjusting, e.g., adhesive volume and spin parameters, to dispose the first adhesive 310 over the central portion 304 of the carrier wafer 300 while leaving the peripheral portion 306 uncoated, substantially as depicted in FIG. 3C.

Figure 3D:
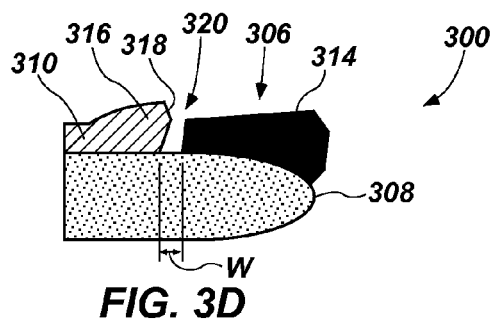

Referring now to FIG. 3D, a second adhesive 314 may be disposed on the peripheral portion 306 of the carrier wafer 300. The second adhesive 314 may be chosen from the materials discussed above with reference to the second adhesive 208 (FIG. 2), or other suitable materials. As a non-limiting example, the second adhesive 314 may be disposed over the area of the peripheral portion 306 of the carrier wafer 300 from which the first adhesive 310 has been removed. A secondary bead 316 of the first adhesive 310 may form adjacent an outer edge 318 of the first adhesive 310, e.g., as a result of surface tension within the first adhesive 310. The second adhesive 314 may be disposed on the peripheral portion 306 by spraying, dispensing from a tip dispensing device such as a syringe, or by other methods.

The second adhesive 314 may be placed to leave a gap 320 between the first adhesive 310 and the second adhesive 314, i.e., such that the first adhesive 310 and the second adhesive 314 do not contact one another. A width w of the gap 320 may be selected based on the size of the secondary bead 316, the thickness of the first adhesive 310, or other factors, and will be discussed further below in connection with FIG. 3G.

Figure 3E:
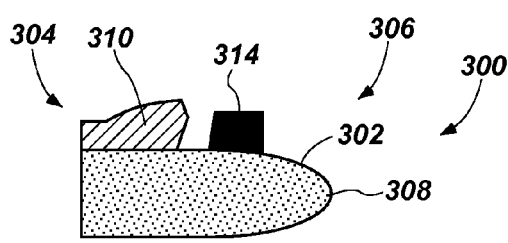

A portion of the second adhesive 314 may be removed from the peripheral portion 306 of the carrier wafer 300. For example, as shown in FIG. 3E, a portion of the second adhesive 314 may be removed from the peripheral portion 306 of the carrier wafer 300. As a non-limiting example, a portion of the second adhesive 314 may be removed to expose an area of the bonding surface 302 extending from the peripheral edge 308 inward toward the central portion 304 (i.e., radially inward) about three hundred micrometers (300 μm) to three millimeters (3 mm). The portion of the second adhesive 314 may be removed, for example, using a solvent, e.g., dodecene, p-Methane, PGMEA, or another suitable solvent.

Following removal of a portion of the second adhesive 314, the carrier wafer 300 may be heated, e.g., baked, to remove undesirable residual solvents, e.g., solvents that may have been used to facilitate application of the adhesives, and/or solvents used to remove portions of the first adhesive 310 and the second adhesive 314. Baking time and temperature may depend on the type and amount of the residual solvents.

Figure 3F:
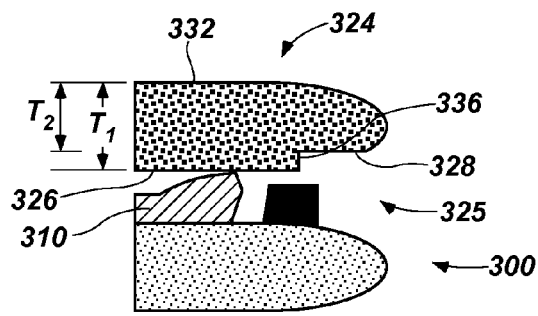

Referring now to FIG. 3F, a device wafer 324 may be aligned with the carrier wafer 300. The device wafer 324 includes a front side 325 (the front side 325 may also be characterized as an active side) with an active surface 326 and a peripheral area 328 having a surface from and parallel to front side 325, with a reduced thickness relative to a thickness of the device wafer 324 at the active surface 326. The active surface 326 may include active semiconductor components, for example and without limitation, memory or logic circuitry at die locations on the active surface 326. The device wafer 324 may have a first thickness $T_1$ from a backside surface 332 to the active surface 326, and a second thickness $T_2$ from the backside surface 332 to the peripheral area 328 of the front side 325. Such a configuration of the device wafer 324 may be referred to in the industry as a "device edge trim." As non-limiting examples, the device wafer 324 may be substantially circular and have a diameter of about 300 mm, and the first thickness $T_1$ may be about seven hundred fifty (750) microns. As a further non-limiting example, the second thickness $T_2$ may be about one hundred (100) microns less than the first thickness $T_1$.

Figure 3G:
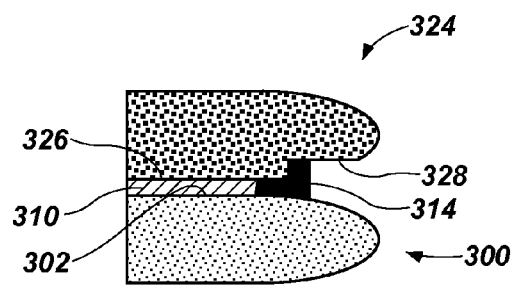

The device wafer 324 may be bonded to the carrier wafer 300 under heat and pressure. For example, the device wafer 324 may be concentrically aligned with the carrier wafer 300 by conventional techniques, and the device wafer 324 and the carrier wafer 300 may be placed in a mechanical press and pressed together under elevated temperature conditions, such as at a temperature about equal to the $T_g$ of the second adhesive 314 but higher than the $T_g$ of the first adhesive 310. As a non-limiting example, the temperature may be raised to at least about one hundred fifty degrees Celsius (150° C.), and the device wafer 324 and the carrier wafer 300 may be pressed together under at least about eight (8) kN up to about thirty (30) kN of force for about two (2) minutes. Bonding conditions of time, temperature, and force may be optimized for viscous interface conditions that depend upon melt viscosity of the first adhesive 310 and the second adhesive 314 at the bond temperature and the density and topology of the device architecture. As the device wafer 324 and the carrier wafer 300 are pressed together under the elevated temperature conditions, the first adhesive 310 melts and flows to fill and protect the topography of active surface 326 of device wafer 324 while bonding the active surface 326 to carrier wafer 300, while the second adhesive 314 may soften without excessive flow (i.e., seepage), bonding the carrier wafer 300 to the peripheral area 328 of the device wafer 324 and in some embodiments to lateral surface 336 extending from active surface 326 to peripheral area 328. Under these conditions, the adhesive material within the secondary bead 316 (FIG. 3D) may flow and fill the gap 320 (FIG. 3D) between the first adhesive 310 and the second adhesive 314 as the available volume between device wafer 324 and carrier wafer 300 decreases. The active surface 326 of the device wafer 324 after bonding is substantially parallel to the bonding surface 302 of the carrier wafer 300 and the first adhesive 310 is substantially evenly distributed between the bonding surface 302 of the carrier wafer 300 and the active surface 326 of the device wafer 324, as shown in FIG. 3G. As also shown in FIG. 3G, the softened, higher glass transition temperature second adhesive 314 may bond to a peripheral portion of the device wafer 324. For example, the second adhesive 314 may bond to at least a portion of the peripheral area 328 and to a peripheral portion of the active surface 326 of the device wafer 324 to form a dam structure containing the first adhesive 310 between carrier wafer 300 and device wafer 324. The second adhesive 314 may not tend to lift the peripheral area 328 of device wafer 324, as the outer boundary of second adhesive 314 is unconstrained and allows peripheral expansion of the second adhesive 314 as device wafer 324 and carrier wafer 300 are pressed together.

Figure 3H:
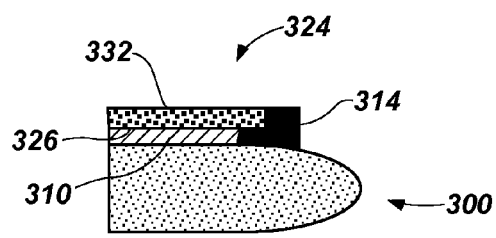

Referring now to FIG. 3H, material may be removed from the backside surface 332 of the device wafer 324. For example, the backside surface 332 may be subjected to a thinning process, such as abrasive grinding, chemical-mechanical polishing, wet etch, or combinations thereof. A thickness of material equal to or greater than the thickness $T_2$ (FIG. 3F) may be removed from the backside surface 332 of the device wafer 324. In other words, the backside surface 332 may be thinned to the extent that the peripheral area 328 (FIG. 3F) of the device wafer 324 is completely removed, leaving only a portion of the device wafer 324 including the active surface 326, as shown in FIG. 3H.

Figure 3I:
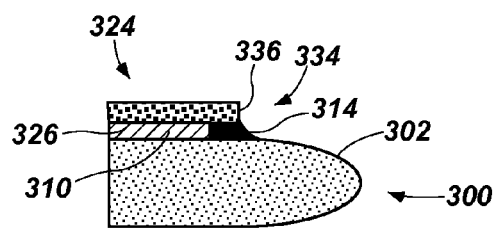

Referring now to FIG. 3I, after thinning of the backside surface 332, excess second adhesive material 314 may be removed as described above (e.g., by application of a solvent) to leave a relatively small portion 334 of the second adhesive 314 extending between the bonding surface 302 of the carrier wafer 300 and the active surface 326 of the device wafer 324, as shown in FIG. 3I.

When backside processing of the device wafer 324 is complete, the device wafer 324 may be debonded from the carrier wafer 300 by heating to a temperature above the $T_g$ of the first adhesive 310 where the shear modulus of the first adhesive 310 is less than or equal to about 1e5 Pa. to reduce the adhesive bond between device wafer 324 and carrier wafer 300. A mechanical shear force may be applied substantially parallel to the bonding surface 302 and the active surface 326 of the device wafer 324 to slide the carrier wafer 300 and the device wafer 324 apart. Because the remaining small portion 334 of second adhesive 314 only bonds to a small area at the periphery of carrier wafer 300 and the active surface 326 of the device wafer 324, the cumulative bonding strength (i.e., the total bonding strength over the entire bonding area) of the second adhesive 314 may be negligible compared to the cumulative bonding strength of the heated, melted first adhesive 310. Thus, the force and temperature utilized to debond the device wafer 324 from the carrier wafer 300 using methods of the present disclosure may be similar to that utilized for debonding when only a single adhesive is used, e.g., a process flow similar to that described above in connection with FIGS. 1A through 1E.

The higher $T_g$ of the second adhesive material 314 relative to the first adhesive material 310 may enable the second adhesive material 314 to maintain its integrity during backside processing acts that involve relatively high temperature (e.g., in excess of about 200° C.) thermal cycles. The portion 334 of the second adhesive 314 may prevent the first adhesive 310 from flowing from between the carrier wafer 300 and the device wafer 324 under elevated temperatures during backside processing. Eliminating the flow may protect the active surface 326 of the device wafer 324 from adhesive squeeze out (i.e., seepage) and contamination during thinning and backside processing acts.

Moreover, adhesive forces between the second adhesive 314, the device wafer 324, and the bonding surface 302 of the carrier wafer 300 may prevent heat-induced warping in the device wafer 324 from causing a peripheral edge of the device wafer 324 to lift away from the bonding surface 302 of the carrier wafer 300. During the thinning and backside processing, the second adhesive 314 may provide sufficient adhesion between the device wafer 324 and the carrier wafer 300 at temperatures that reduce the adhesive strength of first adhesive 310 to reduce or prevent such warping. The disclosed methods may provide increases in thickness uniformity of the thinned device wafer 324, prevent crack formation in the device wafer 324, and increase yields by a reduction in edge die loss.

The disclosure includes a method of bonding a device wafer to a carrier wafer, the method comprising disposing a first adhesive having a glass transition temperature over a central portion of a carrier wafer. A second adhesive having a glass transition temperature greater than the first glass transition temperature is disposed over a peripheral portion of the carrier wafer. The first adhesive is bonded to at least a portion of a front side of a device wafer and the second adhesive is bonded to a peripheral portion of the front side of the device wafer and to a portion of an active surface of the device wafer.

The disclosure also includes a method of bonding a device wafer to a carrier wafer, the method comprising disposing a first adhesive with a first glass transition temperature over the carrier wafer. The first adhesive is removed from a peripheral portion of the carrier wafer, and a second adhesive with a second glass transition temperature higher than the first glass transition temperature is disposed over the peripheral portion of the carrier wafer. The first adhesive is bonded to a central portion of a device wafer and the second adhesive is bonded to a peripheral portion of the device wafer.

Figure 4A:
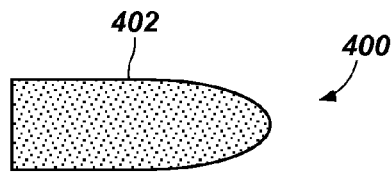
FIGS. 4A through 4F are cross-sectional views showing another temporary bonding method according to another embodiment of the present disclosure.

Referring now to FIGS. 4A through 4F, another process flow for bonding a device wafer to a carrier wafer according to an embodiment of the disclosure is shown and described. In FIG. 4A, a carrier wafer 400 including a bonding surface 402 is shown. The carrier wafer 400 may be similar to the carrier wafer 300 described above in connection with FIGS. 3A through 3I.

Figure 4B:
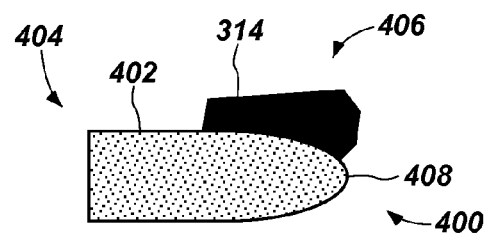

Referring now to FIG. 4B, a second adhesive 314 may be applied to a peripheral portion 406 of the bonding surface 402 of the carrier wafer 400. The second adhesive 314 may be applied by, for example, spraying, dispensing from a tip dispensing device such as a syringe, or by other methods. The second adhesive 314 may be selected as described above in connection with FIGS. 3A through 3I. The area of the peripheral portion 406 over which the second adhesive 314 is disposed may extend from adjacent a peripheral edge 408 inward toward a central portion 404 of the bonding surface 402, for example, up to about twenty (20) mm inward from the peripheral edge 408 (i.e., radially inward). In other embodiments, the area of the peripheral portion 406 over which the second adhesive 314 is disposed may extend from adjacent a peripheral edge 408 inward toward a central portion 404 of the bonding surface 402 by more than about twenty (20) mm. As a non-limiting example, the second adhesive 314 may be disposed to a thickness of between about fifty (50) to one hundred fifty (150) microns.

Figure 4C:
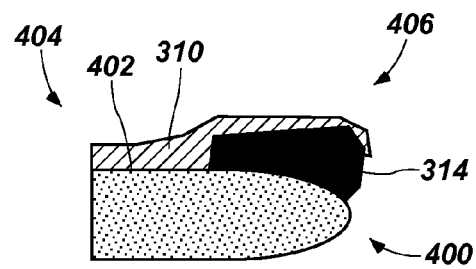

Referring now to FIG. 4C, a first adhesive 310 may be disposed over substantially the entire bonding surface 402 of the carrier wafer 400, including the peripheral portion 406 over which the second adhesive 314 is disposed. The first adhesive 310 may be a material as described in connection with FIGS. 3A through 3I and may be applied to the carrier wafer 400 by conventional techniques, such as by spin coating.

Figure 4D:
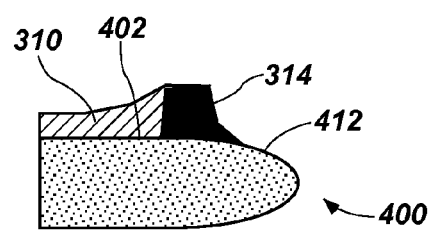

As shown in FIG. 4D, an excess portion of the first adhesive 310 and the second adhesive 314 may be removed from the bonding surface 402 of the carrier wafer 400. For example, the first adhesive 310 and the second adhesive 314 may be dissolved by a solvent, such as dodecene, to leave an outermost area 412 of the bonding surface 402 substantially free of the first adhesive 310 and the second adhesive 314.

Figure 4E:
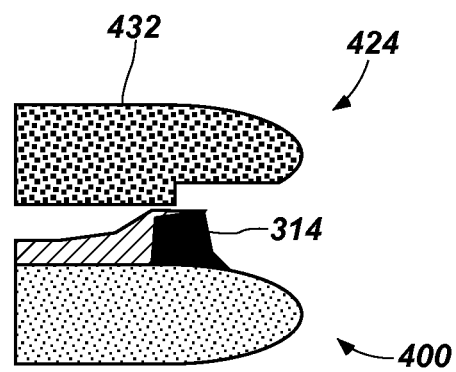
Figure 4F:
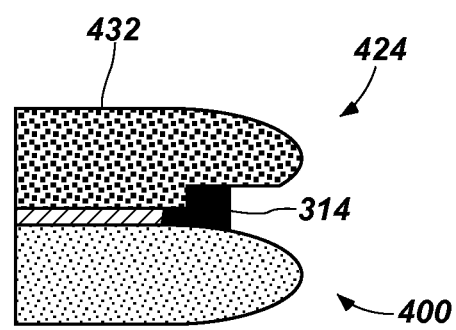

As shown in FIGS. 4E and 4F, a device wafer 424 similar to the device wafer 324 described in connection with FIGS. 3A through 3I may be bonded to the carrier wafer 400 in a manner similar to that described with reference to FIGS. 3F and 3G. Remaining process acts, such as thinning a backside surface 432 and removing excess of the second adhesive 314, may be carried out in a manner similar to that described with reference to FIGS. 3H and 3I. The device wafer 424 may be debonded from the carrier wafer 400 in a manner similar to that previously described.

The disclosure includes a method of bonding a device wafer to a carrier wafer, the method comprising disposing an adhesive having a first glass transition temperature over a peripheral area of the carrier wafer. Another adhesive having a second glass transition temperature lower than the first glass transition temperature is disposed over the carrier wafer and the adhesive having a first glass transition temperature. A portion of the adhesive having a first glass transition temperature and a portion of the another adhesive having a second glass transition temperature is removed from the peripheral area of the carrier wafer. The adhesive having a first glass transition temperature and the another adhesive having a second glass transition temperature are bonded to a device wafer.

The area of the carrier wafer over which the second adhesive is disposed may be chosen to provide a particular desired bond strength at the periphery of the device wafer. In some embodiments, the second adhesive may be disposed over an area of the carrier wafer such that a greater portion of the second adhesive is disposed between the active surface of the front side of the device wafer and the carrier wafer compared to the embodiments of FIGS. 3A through 3I and 4A through 4F. For example, the method shown in FIGS. 5A through 5C may be similar to the methods shown in FIGS. 3A through 3I and 4A through 4F, but the second adhesive may be disposed over a wider area, such that a greater portion of the second adhesive is disposed between the carrier wafer and an active surface of the device wafer.

Figure 5A:
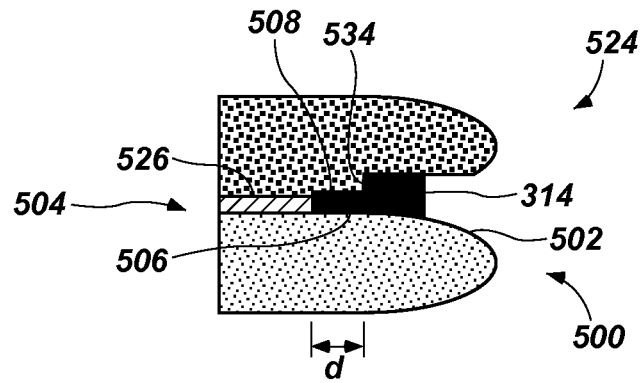
FIGS. 5A through 5C are cross-sectional views showing yet another temporary bonding process method according to another embodiment of the present disclosure.

Referring now to FIG. 5A, in an additional embodiment, the second adhesive 314 may be disposed over a peripheral portion 506 of a bonding surface 502 of a carrier wafer 500 such that the second adhesive 314 bonds to a peripheral area 508 of an active surface 526 of a device wafer 524. The second adhesive 314 may extend a distance d inward toward a central portion 504 of the carrier wafer 500 (i.e., radially inward) from a lateral surface 534 surrounding the active surface 526 of the device wafer 524. As non-limiting examples, the distance d may be between about four millimeters (4 mm) and about twenty millimeters (20 mm).

Figure 5B:
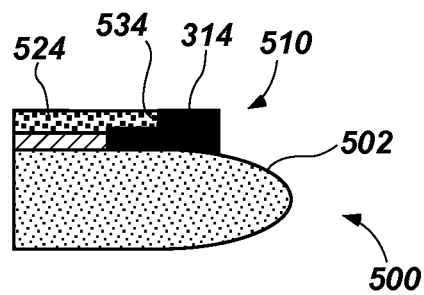

As shown in FIG. 5B, the device wafer 524 may be thinned as described above in connection with FIG. 3H. Following thinning, an excess portion 510 of the second adhesive 314 may be removed to leave an outermost area 512 of the bonding surface 502 substantially free of the second adhesive, as shown in FIG. 5C.

Figure 5C:
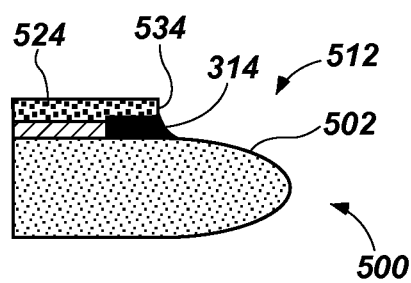

In the embodiment of FIGS. 5A-5C, the second adhesive 314 disposed between the active surface 526 of the device wafer 524 and the bonding surface 502 of the carrier wafer 500 over the peripheral distance d (FIG. 5A) may provide increased bond strength adjacent the lateral surface 534 of the device wafer 524 compared to the configurations shown and described in FIGS. 3A through 3I and FIGS. 4A through 4F. Such increased bond strength may be desirable when the device wafer 524 is particularly prone to heat-induced warping. For example, a device wafer 524 with a relatively high density of features on the active surface 526 may be more prone to warping than a device wafer with a relatively lower feature density. The peripheral distance d, and thus the area over which the second adhesive 314 acts to bond the active surface 526 to the bonding surface 502, may be chosen based on the propensity of the device wafer 524 to warp during heat cycles. For example, a relatively greater peripheral distance d may be chosen for an application involving a wafer device more prone to edge peeling due to heat-induced warping than would be chosen for an application involving a wafer device less prone to such edge peeling. Tailoring the peripheral width and strength of the second adhesive 314 to the properties of a device wafer affecting its tendency to warp enables effective device wafer warpage management through selective bond strength. In addition, second adhesive 314 may be tailored with respect to its function as a dam structure in terms of a slightly higher thermal stability in terms of higher melt viscosity to preclude seepage of first adhesive 310.

Further, first adhesive 310 may be optimized to provide interface properties between a device wafer and a carrier wafer with respect to topography and conductive elements (e.g., solder bumps) combined with favorable debonding parameters such as debonding temperature and device wafer slide speed.

Superior adhesion of the device wafer to the carrier wafer by using a two (inner and outer) zone adhesive bonding approach device may eliminate wafer edge chipping, device wafer delamination, crack formation, and loss of die. Overall thickness uniformity of the thinned device wafer is increased, increasing yield by reducing edge die loss. Other processing steps may also be simplified since the incoming device wafer/carrier wafer stack is flat. As a non-limiting example, abrasive processing, such as CMP processing, and device wafer backside plating each benefit from flat, well-adhered device wafer/carrier wafer stacks.

The disclosure includes a method of bonding a device wafer to a carrier wafer, the method comprising disposing a first adhesive having a first glass transition temperature over a portion of the carrier wafer. A second adhesive having a second glass transition temperature is disposed over a portion of the carrier wafer. The first adhesive is bonded to a central portion of an active surface of a device wafer, and the second adhesive is bonded to a peripheral portion of the active surface of the device wafer.

The disclosure also includes an assembly including a carrier wafer and a device wafer having an active surface facing the carrier wafer. A first thermoplastic adhesive material is between the carrier wafer and the device wafer. A second thermoplastic material exhibiting a higher glass transition temperature than a glass transition temperature exhibited by the first thermoplastic adhesive material peripherally surrounds the first adhesive material between the carrier wafer and the device wafer.

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure.

What is claimed is:

1. A method of bonding a device wafer to a carrier wafer, comprising:
    disposing a first thermoplastic adhesive having a first glass transition temperature of less than or equal to about 200° C. over a central portion of a carrier wafer;
    disposing a second thermoplastic adhesive having a second glass transition temperature of at least about fifteen degrees Celsius (15° C.) greater and less than about twenty-five degrees Celsius (25° C.) greater than the first glass transition temperature over a peripheral portion of the carrier wafer; and
    bonding the first thermoplastic adhesive to at least a portion of a front side of a device wafer and the second thermoplastic adhesive to a peripheral portion of the front side of the device wafer.

2. The method of claim 1, wherein disposing the first thermoplastic adhesive over the central portion of the carrier wafer comprises disposing the first thermoplastic adhesive over substantially the entire surface of the carrier wafer and at least partially removing the first thermoplastic adhesive from the peripheral portion of the carrier wafer.

3. The method of claim 2, wherein at least partially removing the first thermoplastic adhesive from the peripheral portion of the carrier wafer comprises removing the first thermoplastic adhesive from an area extending from a periphery of the carrier wafer up to about twenty (20) mm radially inward.

4. The method of claim 2, wherein at least partially removing the first thermoplastic adhesive from the peripheral portion of the carrier wafer comprises applying a solvent to the first thermoplastic adhesive disposed over the peripheral portion of the carrier wafer.

5. The method of claim 2, wherein disposing the second thermoplastic adhesive over the peripheral portion of the carrier wafer comprises disposing the second thermoplastic adhesive over the area of the peripheral portion of the carrier wafer from which the first thermoplastic adhesive is removed.

6. The method of claim 5, further comprising removing an outer peripheral portion of the second thermoplastic adhesive with a solvent.

7. The method of claim 1, wherein disposing the first thermoplastic adhesive over the central portion of the carrier wafer and disposing the second thermoplastic adhesive over the peripheral portion of the carrier wafer comprise disposing the second thermoplastic adhesive over the peripheral portion of the carrier wafer and subsequently disposing the first thermoplastic adhesive over the central portion of the carrier wafer and at least a portion of the second thermoplastic adhesive.

8. The method of claim 7, further comprising removing a portion of the second thermoplastic adhesive and the first thermoplastic adhesive from an outermost area of the peripheral portion of the carrier wafer.

9. The method of claim 1, wherein bonding the first thermoplastic adhesive to the at least a portion of the front side of the device wafer and the second thermoplastic adhesive to the peripheral portion of the front side of the device wafer comprises heating the first thermoplastic adhesive and the second thermoplastic adhesive and pressing the front side of the device wafer onto the heated first adhesive and second adhesive.

10. The method of claim 9, wherein heating the first thermoplastic adhesive and the second thermoplastic adhesive comprises heating the first thermoplastic adhesive and the second thermoplastic adhesive to at least about one hundred fifty degrees Celsius (150° C.).

11. The method of claim 1, further comprising reducing a thickness of the device wafer by removing material from a backside of the device wafer.

12. The method of claim 1, wherein bonding the second thermoplastic adhesive to the peripheral portion of the front side of the device wafer further comprises bonding the second adhesive to a lateral side surface of the device wafer adjacent to and surrounding the active surface.

13. A method of bonding a device wafer to a carrier wafer, comprising:
    disposing a first adhesive having a first glass transition temperature over substantially an entire surface of a carrier wafer and removing the first adhesive from an area extending from a periphery of the carrier wafer more than about twenty (20) mm radially inward to leave the first adhesive over a central portion of the carrier wafer;
    disposing a second adhesive having a second glass transition temperature greater than the first glass transition temperature over a peripheral portion of the carrier wafer; and
    bonding the first adhesive to a central portion of a front side of a device wafer and the second adhesive to a peripheral portion of the front side of the device wafer.

14. A method of bonding a device wafer to a carrier wafer, comprising:
    disposing a first adhesive having a first glass transition temperature over a central portion of a carrier wafer;
    disposing a second adhesive having a second glass transition temperature greater than the first glass transition temperature over a peripheral portion of the carrier wafer, comprising disposing the second adhesive over the peripheral portion of the carrier wafer to leave a gap between the second adhesive and the first adhesive; and
    bonding the first adhesive to at least a portion of a front side of a device wafer and the second adhesive to a peripheral portion of the front side of the device wafer.

15. A method of bonding a device wafer to a carrier wafer, comprising:
    disposing a first adhesive having a first glass transition temperature over a central portion of a carrier wafer;
    disposing a second adhesive having a second glass transition temperature greater than the first glass transition temperature over a peripheral portion of the carrier wafer; and
    bonding the first adhesive to at least a portion of a front side of a device wafer and the second adhesive to a peripheral portion of the front side of the device wafer, comprising:
        heating the first adhesive and the second adhesive; and
        pressing the front side of the device wafer onto the heated first adhesive and second adhesive, comprising pressing the device wafer and the carrier wafer together with between about eight (8) kN and thirty (30) kN of force.

16. A method of bonding a device wafer to a carrier wafer, comprising:
    disposing a first adhesive with a first glass transition temperature over a carrier wafer;
    removing the first adhesive from a peripheral portion of the carrier wafer;
    disposing a second adhesive with a second glass transition temperature higher than the first glass transition temperature over the peripheral portion of the carrier wafer and out of contact with the first adhesive; and bonding the first adhesive to a central portion of a device wafer and the second adhesive to a peripheral portion of the device wafer.

17. A method of bonding a device wafer to a carrier wafer, comprising:
- disposing a first adhesive having a first glass transition temperature over a portion of a carrier wafer;
- disposing a second adhesive having a second glass transition temperature over a portion of the carrier wafer; and
- bonding the first adhesive to a central portion of an active surface of a device wafer and bonding the second adhesive to a lateral side surface of the device wafer adjacent to and surrounding the active surface of the device wafer and to a peripheral portion of the active surface of the device wafer extending radially inward from the lateral side surface of the device wafer.

18. The method of claim 17, wherein bonding the second adhesive to the peripheral portion of the active surface of the device wafer comprises bonding the second adhesive to the peripheral portion of the active surface of the device wafer extending between about four (4) mm and about twenty (20) mm radially inward from the lateral side surface of the device wafer surrounding the active surface.

\* \* \* \* \*